(12) United States Patent
Xiong et al.

(10) Patent No.: US 11,275,264 B2
(45) Date of Patent: Mar. 15, 2022

(54) DISPLAY SUBSTRATE, MANUFACTURING METHOD THEREOF, DISPLAY PANEL AND MASK PLATE

(71) Applicants: Chongqing BOE Optoelectronics Technology Co., Ltd., Chongqing (CN); BOE Technology Group Co., Ltd., Beijing (CN)

(72) Inventors: Qiang Xiong, Beijing (CN); Yuli Dai, Beijing (CN); Yuanhong Peng, Beijing (CN); Bin Wan, Beijing (CN); Ya Zeng, Beijing (CN); Chao Liu, Beijing (CN); Xiongzhou Wei, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 60 days.

(21) Appl. No.: 16/962,962

(22) PCT Filed: Nov. 20, 2019

(86) PCT No.: PCT/CN2019/119710
§ 371 (c)(1),
(2) Date: Jul. 17, 2020

(87) PCT Pub. No.: WO2020/151351
PCT Pub. Date: Jul. 30, 2020

(65) Prior Publication Data
US 2021/0215962 A1    Jul. 15, 2021

(30) Foreign Application Priority Data

Jan. 24, 2019 (CN) .......................... 201910067728.9

(51) Int. Cl.
*G06F 3/041* (2006.01)
*G02F 1/1333* (2006.01)
(Continued)

(52) U.S. Cl.
CPC ............ *G02F 1/13338* (2013.01); *G03F 1/38* (2013.01); *G06F 3/041* (2013.01);
(Continued)

(58) Field of Classification Search
CPC ........... G02F 1/13338; G02F 1/133514; G02F 1/133528; G03F 1/38; G06F 3/041;
(Continued)

(56) References Cited

U.S. PATENT DOCUMENTS 8,004,620 B2 * 8/2011 Ishii ................... G02F 1/133308
349/12
8,508,701 B2 * 8/2013 Nakagawa .......... H01L 51/5246
349/122

(Continued)

FOREIGN PATENT DOCUMENTS

CN    103207710 A    7/2013
CN    104407733 A    3/2015
(Continued)

OTHER PUBLICATIONS

First Office Action dated May 18, 2020 for application No. CN201910067728.9 with English translation attached.

*Primary Examiner* — Pegeman Karimi
(74) *Attorney, Agent, or Firm* — Nath, Goldberg & Meyer; Joshua B. Goldberg

(57) ABSTRACT

The present disclosure provides a display substrate including a base substrate, a touch electrode layer on a light emergent side of the base substrate, a protection unit formed on a side of the touch electrode layer distal to the base substrate, the touch electrode layer comprises a touch function part and a (Continued)

binding part located at a side of the touch function part, the protection unit comprises a first part and a second part, the first part is located at a side of the binding part distal to base substrate and covers the binding part, the second part is located at a side of the touch function part distal to the base substrate, the second part comprises multiple protection blocks which are arranged at intervals, a maximum thickness of each protection blocks along a normal direction of the base substrate is less than that of the first part.

21 Claims, 3 Drawing Sheets

(51) Int. Cl.
    *G03F 1/38*     (2012.01)
    *G02F 1/1335*     (2006.01)

(52) U.S. Cl.
    CPC .. *G02F 1/133514* (2013.01); *G02F 1/133528* (2013.01); *G06F 2203/04103* (2013.01)

(58) Field of Classification Search
    CPC .. G06F 2203/04103; G06F 3/02; G06F 3/045; G06F 3/038; G09G 5/00
    See application file for complete search history.

(56) References Cited

U.S. PATENT DOCUMENTS

| | | | |
|---|---|---|---|
| 10,367,173 | B1* | 7/2019 | Wu .......................... G02B 1/14 |
| 2011/0249222 | A1 | 10/2011 | Nakagawa et al. |
| 2021/0255717 | A1* | 8/2021 | Lei ........................... G06F 3/041 |
| 2021/0255739 | A1* | 8/2021 | Hashida ................. G06F 3/0446 |

FOREIGN PATENT DOCUMENTS

| | | |
|---|---|---|
| CN | 107870683 A | 4/2018 |
| CN | 108169841 A | 6/2018 |
| CN | 108227290 A | 6/2018 |
| CN | 108984022 A | 12/2018 |
| CN | 109254696 A | 1/2019 |
| CN | 109581716 A | 4/2019 |
| KR | 20170060977 A | 6/2017 |

\* cited by examiner

DISPLAY SUBSTRATE, MANUFACTURING METHOD THEREOF, DISPLAY PANEL AND MASK PLATE

CROSS-REFERENCE TO RELATED APPLICATIONS

The present application is a U.S. National Stage Application under 35 U.S.C. § 371 of International Patent Application No, PCT/CN2019/119710, filed on Nov. 20, 2019, which claims priority to China Patent Application No. 201910067728.9 filed Jan. 24, 2019, the disclosure of both which are incorporated by reference herein in entirety.

TECHNICAL FIELD

The present disclosure relates to the field of display devices, and in particular, to a display substrate, a display panel including the display substrate, a manufacturing method of the display substrate, and a mask plate.

BACKGROUND

Touch display devices have been developed to facilitate user's operation and input to the display devices. The touch display device includes a touch electrode layer, an array substrate and an opposite substrate arranged oppositely to the array substrate. In order to reduce a thickness of the touch display device, the touch electrode layer may be disposed on a surface of the opposite substrate distal to the array substrate.

SUMMARY

An embodiment of the present disclosure provides a display substrate, including a base substrate, a touch electrode layer formed on a light emergent side of the base substrate, and a protection unit formed on a side of the touch electrode layer distal to the base substrate, the touch electrode layer includes a touch function part and a binding part located at a side of the touch function part. The protection unit includes a first part and a second part, the first part is located at a side of the binding part distal to base substrate and covers the binding part, the second part is located at a side of the touch function part distal to the base substrate, and the second part includes a plurality of protection blocks which are arranged at intervals, a maximum thickness of each of the protection blocks along a normal direction of the base substrate is less than a thickness of the first part along the normal direction of the base substrate.

In some implementations, maximum thicknesses of the plurality of protection blocks in the normal direction of the base substrate decrease progressively in a direction from the binding part to the touch function part, and maximum cross-sectional areas of the plurality of protection blocks perpendicular to the normal direction of the base substrate decrease progressively in a direction from the binding part to the touch function part.

In some implementations, the plurality of protection blocks are arranged in rows and columns, the plurality of protection blocks are located at a single side of the first part in a longitudinal direction of the first part, a row direction of the plurality of protection blocks is identical to the longitudinal direction of the first part, a column direction of the plurality of protection blocks is perpendicular to the longitudinal direction of the first part, and the protection blocks of odd-numbered columns and the protection blocks of even-numbered columns are staggered from each other in the column direction.

In some implementations, a cross-section of each of the plurality of protection blocks in a direction perpendicular to the normal direction of the base substrate has a semicircular shape.

In some implementations, a diameter of a maximum cross-section of each of the protection blocks in the direction perpendicular to the normal direction of the base substrate satisfies the following formula:

$$D = L/(2n-1),$$

wherein L is a width of the first part;

n is a row number of a row in which the protection block is located, a row of protection blocks closest to the first part is a first row of protection blocks, and n is more than or equal to 1;

D is the diameter of the maximum cross-section of the protection block in the direction perpendicular to the normal direction of the base substrate.

In some implementations, the display substrate further includes a color filter layer located on a light incident side of the display substrate.

In some implementations, the display substrate further includes a transparent optical film layer covering the touch electrode layer, wherein the protection unit is located between the transparent optical film layer and the touch electrode layer.

In some implementations, the transparent optical film layer includes a polarizer.

In some implementations, the first part has a thickness ranging from 1 μm to 5 μm.

An embodiment of the present disclosure provides a display panel including the display substrate mentioned above.

An embodiment of the present disclosure provides a mask plate, which is used for forming the protection unit of the display substrate mentioned above, and the mask plate includes a first region and a second region located at a side of the first region, wherein the second region includes a first light transmission portion and a plurality of second light transmission portions arranged at intervals, the first light transmission portion and the second light transmission portions penetrate through the mask plate in a thickness direction of the mask plate, the plurality of second light transmission portions are located at a single side of the first light transmission portion, an area of each of the second light transmission portions is smaller than an area of the first light transmission portion, the first light transmission portion is configured for forming the first part, and the second light transmission portions are configured for forming the second part.

In some implementations, areas of the plurality of second light transmission portions decrease progressively in a direction from the first region to the second region.

In some implementations, the plurality of second light transmission portions are arranged in rows and columns, and are located at a single side of the first light transmission portion in a longitudinal direction of the first light transmission portion, a row direction of the plurality of second light transmission portions is identical to the longitudinal direction of the first light transmission portion, a column direction of the plurality of second light transmission portions is perpendicular to the longitudinal direction of the first light transmission portion, and the second light transmission portions of odd-numbered columns and the second light transmission portions of even-numbered columns are staggered from each other in the column direction.

In some implementations, the second light transmission portion has a semicircular shape.

In some implementations, a diameter of the second light transmission portion satisfies the following formula:

$$d=l/(2m-1),$$

wherein l is a width of the first light transmission portion; m is a row number of a row where the second light transmission portion is located, m is more than or equal to 1, where a row of second light transmission portions closest to the first light transmission portion is a first row of second light transmission portions;

d is the diameter of the second light transmission portion.

An embodiment of the present disclosure provides a manufacturing method of a display substrate, the display substrate includes a base substrate, a touch electrode layer formed on a light emergent side of the base substrate, and a protection unit formed on a side of the touch electrode layer distal to the base substrate, the touch electrode layer includes a touch function part and a binding part located at a side of the touch function part, the protection unit includes a first part and a second part, the first part is located at a side of the binding part distal to base substrate and covers the binding part, the second part is located at a side of the touch function part distal to the base substrate, and the second part includes a plurality of protection blocks which are arranged at intervals, a maximum thickness of each of the protection blocks along a normal direction of the base substrate is less than a thickness of the first part along the normal direction of the base substrate, wherein the manufacturing method of the display substrate includes the following steps:

forming the touch electrode layer on a side of the base substrate; and forming the protection unit on a side of the touch electrode layer distal to the base substrate.

In some implementations, the step of forming the protection unit further includes:

coating an entire layer of photosensitive transparent adhesive layer on a side of the touch electrode layer distal to the base substrate;

exposing the photosensitive transparent adhesive layer by using a mask plate; and developing the exposed photosensitive transparent adhesive layer to obtain the protection unit.

In some implementations, the step of forming the protection unit further includes:

in a direction from the binding part to the touch function part, forming the plurality of the protection blocks such that maximum thicknesses of the protection blocks decrease progressively in a normal direction of the base substrate, and areas of maximum cross-sections of the protection blocks in a direction perpendicular to the normal direction of the base substrate decrease progressively.

In some implementations, the step of forming the protection unit further includes: forming the plurality of protection blocks in rows and columns, where the protection blocks are located at a single side of the first part in a longitudinal direction of the first part, a row direction of the plurality of protection blocks is identical to the longitudinal direction of the first part, a column direction of the plurality of protection blocks is perpendicular to the longitudinal direction of the first part, and the protection blocks of odd-numbered columns and the protection blocks of even-numbered columns are staggered from each other in the column direction.

In some implementations, the step of forming the protection unit further includes:

forming each of the plurality of protection blocks such that a cross-section of each of the plurality of protection blocks in the direction perpendicular to the normal direction of the base substrate has a semicircular shape.

In some implementations, the manufacturing method further includes:

forming an optical film layer on a side of the protection unit distal to the base substrate.

DESCRIPTION OF DRAWINGS

The drawings are intended to provide a further understanding of the present disclosure and form a part of the specification. Together with the following specific embodiments, the drawings are used to interpret the present disclosure, but do not constitute a limitation to the present disclosure. In the drawings:

FIG. 3a is a schematic cross-sectional view of a form of protection unit in a display substrate of the display panel shown in FIG. 2, wherein FIG. 3a shows only a portion of the protection unit;

FIG. 3b is a schematic cross-sectional view of another form of protection unit in the display substrate of the display panel shown in FIG. 2, wherein FIG. 3b shows only a portion of the protection unit;

DESCRIPTION OF EMBODIMENTS

The specific embodiments of the present disclosure will be described in detail with reference to the accompanying drawings. It should be understood that the specific embodiments described herein are for the purpose of explaining and interpreting the present disclosure and are not intended to limit the present disclosure.

In the related art, in order to protect a touch electrode layer of a touch display device or implement other optical functions, a transparent optical film is generally disposed on the touch electrode layer. In an embodiment shown in FIG. 1, a polarizing film 13 capable of implementing a polarizing function is disposed on the touch electrode layer.

Figure 1:
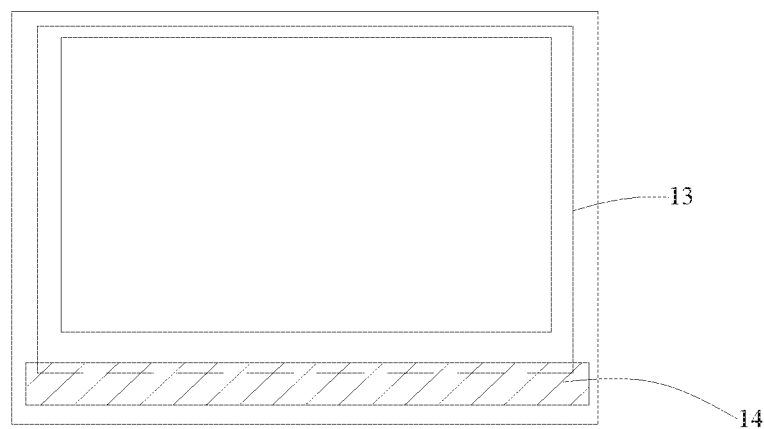
FIG. 1 is a top view of a display panel in the related art.

Generally, the touch electrode layer includes a touch function part and a binding part electrically coupled to each other, a chip for driving the touch function part is electrically coupled to the binding part to provide a driving signal for the touch function part. In order to prevent moisture and oxygen in the air from corroding the binding part of the touch electrode layer, as shown in FIG. 1, the binding part may be covered with a transparent adhesive 14, and then the touch function part and the binding part covered with the transparent adhesive 14 may be covered with the polarizing film 13.

Since there is a step difference between a surface of the transparent adhesive 14 distal to the touch electrode layer and a surface of the touch electrode layer facing the polarizing film 13, when the polarizing film 13 is attached, air bubbles are easily generated at a side of the transparent adhesive 14 facing an edge of a display area of a display surface of the touch display device, which affects an appearance of a product.

In order to avoid the air bubbles, a measure adopted in the related art is to reduce the thickness of the transparent adhesive 14. However, reducing the thickness of the transparent adhesive 14 results in a reduction of its function of isolating moisture and oxygen.

Therefore, how to ensure the function of isolating moisture and oxygen by the transparent adhesive and avoid the air bubbles on a side of the transparent adhesive facing a middle portion of the display surface of the touch display device after the transparent optical film layer is arranged becomes a technical problem to be solved urgently in the field.

Figure 2:
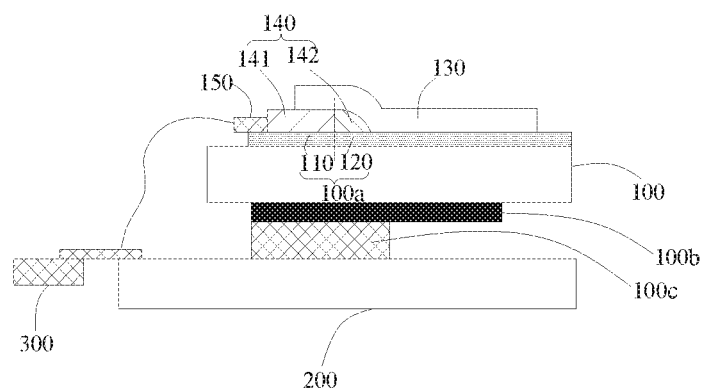
FIG. 2 is a partial cross-sectional view of a display panel according to an embodiment of the present disclosure.

As an aspect of the present disclosure, there is provided a display substrate, as shown in FIG. 2, the display substrate includes a base substrate 100, a touch electrode layer 100a formed on a light emergent side of the base substrate 100, and a protection unit 140 formed on a side of the touch electrode layer 100a distal to the base substrate 100.

The touch electrode layer 100a includes a touch function part 120 and a binding part 110 located at a side of the touch function part 120, and the binding part 110 is electrically coupled to a driving chip 150 for providing a touch driving signal, so that the driving chip 150 can provide the touch driving signal to the touch function part 120 through the binding part 110.

Figure 3A:
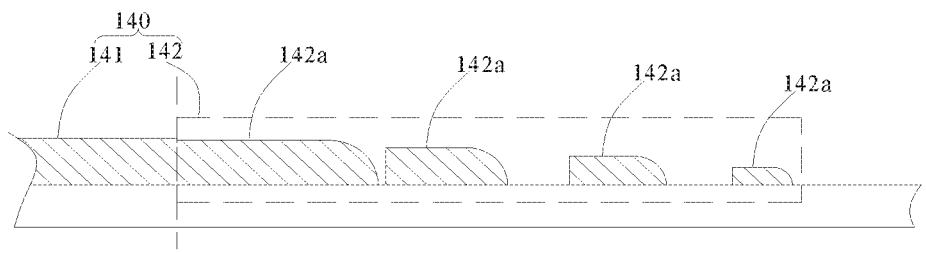
Figure 3B:
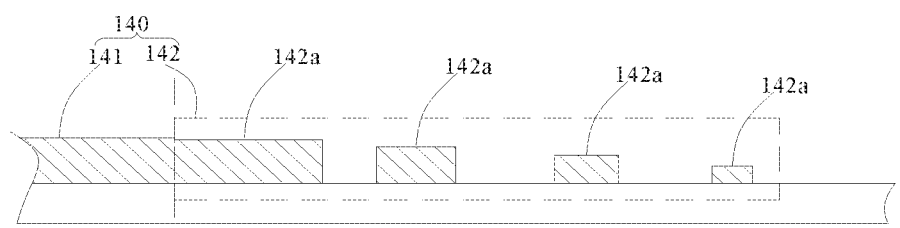

As shown in FIGS. 2, 3a and 3b, the protection unit 140 includes a protection part 141 and a transition part 142. The protection part 141 is located at a side of the binding part 110 distal to the base substrate 100 and covers the binding part 110, the transition part 142 is formed at a side of the touch function part 120 distal to the base substrate 100, the transition part 142 includes a plurality of protection blocks 142a, and the plurality of protection blocks 142a are arranged at intervals. A maximum thickness of each of the protection blocks 142a in a normal direction of the base substrate 100 is smaller than a thickness of the protection part 141 in the normal direction of the base substrate 100. It is noted that the transition part 142 is disposed adjacent to the protection part 141, and in some implementations, the protection block 142a closest to the protection part 141 is connected to the protection part 141.

In the display substrate provided by the present disclosure, the protection blocks 142a and the protection part 141 are both made of transparent adhesive. The protection part 141 is located on a surface of the binding part 110 distal to the base substrate 100, thereby functioning to prevent moisture and oxygen from corroding the binding part 110. Since the transition part 142 is disposed adjacent to the protection part 141, and the maximum thickness of each of the protection blocks 142a in the transition part 142 along the normal direction of the base substrate 100 is smaller than the thickness of the protection part 141 along the normal direction of the base substrate 100, the step difference between the entire protection unit and the surface of the touch function part 120 distal to the base substrate 100 can be reduced, and after the transparent optical film layer 130 (the transparent optical film layer 130 may be a polarizer) is formed on the side of the touch electrode layer 100a distal to the base substrate 100, air bubbles between the side of the protection unit 140 facing the edge of the display area of the display substrate and the transparent optical film layer 130 can be reduced or even eliminated, thereby improving the appearance of the display panel.

The transition part 142 is formed to include the plurality of protection blocks 142a in the present embodiment can reduce a difficulty of manufacturing the transition part 142.

In the present disclosure, how to form the protection blocks 142a of the transition part 142 with thicknesses decreasing progressively is not particularly limited, for example, a photosensitive transparent adhesive layer may be exposed by using a halftone mask plate to obtain the protection blocks 142a with the thicknesses decreasing progressively. However, the present disclosure is not limited thereto, and the protection unit may be formed by using a mask plate shown in FIG. 5, for example.

How to form the protection unit 140 is described below.

Firstly, a whole layer of photosensitive transparent adhesive layer is coated on the touch electrode layer, the photosensitive transparent adhesive layer is exposed by using a mask plate, and then the exposed photosensitive transparent adhesive layer is developed to obtain the protection unit.

Figure 5:
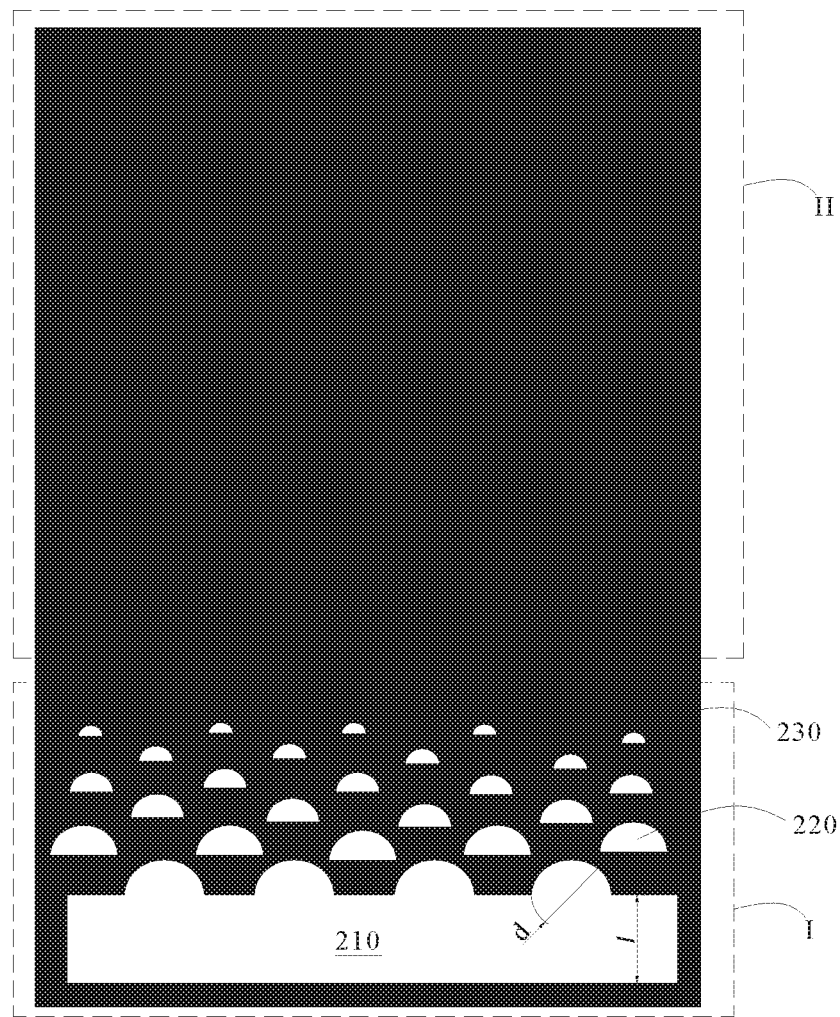
FIG. 5 is a schematic view of a mask plate according to an embodiment of the present disclosure.

In the present disclosure, the mask plate is not particularly limited to a specific pattern. When the photosensitive transparent adhesive layer is formed of negative photosensitive transparent adhesive, the photosensitive transparent adhesive layer may be exposed by using the mask plate as shown in FIG. 5. Specifically, as shown in FIG. 5, the mask plate includes a light blocking body 230, and the light blocking body 230 is divided into a complete blocking region II at a side and a pattern region I at a side of the complete blocking region II. It should be noted that, for designing the mask plate, positions of the pattern region I and the complete blocking region II should be determined according to positions of the binding part and the touch function part of the touch electrode layer.

A main light transmission portion 210 and a plurality of light transmission units 220 arranged at intervals are formed in the pattern region I, and the main light transmission portion 210 and the plurality of light transmission units 220 penetrate through the light blocking body 230 in a thickness direction of the mask plate. The light transmission units 220 are located at a single side of the main light transmission portion 210, and an area of each of the light transmission units 220 is smaller than that of the main light transmission portion 210.

When the photosensitive transparent adhesive layer is coated, the photosensitive transparent adhesive layer is coated to cover the entire touch electrode layer other than only cover a part of the touch electrode layer on which the protection unit is to be formed, so that a coating efficiency can be improved. A portion of the photosensitive transparent adhesive layer corresponding to the complete blocking part II covers a portion of the touch function part on which no transition part needs to be provided, and the portion of the photosensitive transparent adhesive layer corresponding to the complete blocking part II is not irradiated by light and completely removed during development.

The smaller the area of the light transmission unit 220 is, the smaller the amount of light transmission is, and therefore, the smaller the amount of exposure of the photosensitive transparent adhesive layer by the light transmitting unit 220 is, so that the smaller the thickness of the protection block formed from the development is. Therefore, the protection unit having the above-described structure provided by the present disclosure can be easily formed by using the mask plate provided by the present disclosure.

In order to better avoid air bubbles at the side of the protection unit 140 facing the edge of the display area during forming the transparent optical film layer 130, in an embodiment, the thicknesses of the protection blocks 142a of the transition part 142 are decreased progressively in a direction from the protection part 141 to the display area of the display substrate. Specifically, for the protection blocks 142a, the maximum thicknesses of the protection blocks 142a in the normal direction of the base substrate 100 decrease progressively in a direction from the binding part 110 to the touch function part 120. The closer the protection block 142a to the binding part 110, the greater the maximum thickness of the protection block 142a along the normal direction of the base substrate 100 is. In addition, in the direction from the binding part 110 to the touch function part 120, maximum cross-sectional areas of the protection block 142a in a direction perpendicular to the normal direction of the substrate decreases progressively.

In the present disclosure, each of the protection blocks 142a is not particularly limited to a specific shape, and for example, a side surface of the protection block 142a distal to the protection part 141 may be a curved surface (as shown in FIG. 3a) or a flat surface (as shown in FIG. 3b).

Figure 4:
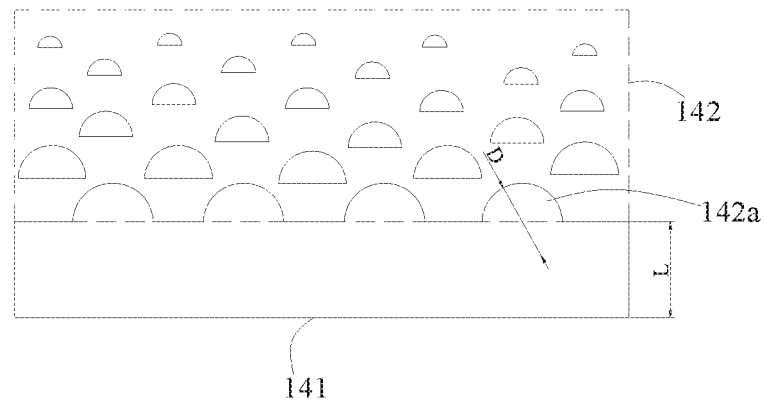
FIG. 4 is a top view of a protection unit in a display substrate according to an embodiment of the present disclosure.

In the present disclosure, there is no particular limitation on an arrangement of the protection blocks 142a, and in an embodiment, as shown in FIG. 4, the protection blocks 142a are arranged in a plurality of rows and a plurality of columns. The protection blocks 142a are formed at a same single side of the protection part 141 in a longitudinal direction of the protection part 141, the row direction of the protection blocks 142a is identical to the longitudinal direction of the protection part 141, and the column direction of the protection blocks 142a is perpendicular to the longitudinal direction of the protection part 141. For convenience of molding, in an embodiment, the protection blocks 142a of the odd-numbered columns and are staggered from the protection blocks 142a of the even-numbered columns are staggered from each other in the column direction.

In an embodiment, a shape of the cross-section of each of the protection blocks 142a in the direction perpendicular to the normal direction of the base substrate is a semicircular.

A diameter of the cross-section of each of the protection blocks 142a may be determined according to a width of the protection part 141. As an implementation, the maximum diameter of the protection block satisfies the following formula:

$$D=L/(2n-1),$$

Where L is the width of the protection part 141;

n is the row number of the row in which the protection block is located, a row of protection blocks closest to the protection part is a first row of protection blocks, and n is more than or equal to 1;

D is the diameter of the maximum cross-section of the protection block in the direction perpendicular to the normal direction of the base substrate.

The display substrate provided by the present disclosure is used as an opposite substrate to be aligned and assembled with an array substrate. In an embodiment, the display substrate further includes a color filter layer disposed on the other side of the base substrate. In other words, the display substrate can be used as a color filter substrate.

As shown in FIG. 2, the display substrate may further include a black matrix 100b disposed at a light incident side of the base substrate 100.

In the present disclosure, as described above, the display substrate further includes the transparent optical film layer 130 covering the touch electrode layer, and the protection unit is located between the transparent optical film layer 130 and the touch electrode layer. Specifically, the protection part 141 is formed on the binding part 110 and at a side of the binding part 110 distal to the base substrate, and the transition part 142 is formed on the touch function part 120 and at a side of the binding part 110 distal to the base substrate.

The display substrate provided by the present disclosure is generally applied to a liquid crystal display device, and accordingly, the transparent optical film layer 130 includes a polarizer.

As described above, the thickness of the protection part 141 is enough to isolate moisture and oxygen, and in an embodiment, the protection part 141 has a thickness ranging from 1 μm to 5 μm.

The display substrate in the present embodiment can effectively prevent moisture and oxygen from eroding the binding part, can avoid air bubbles at a side of the transparent adhesive facing the edge of the display surface of the touch display device after the transparent optical film layer is formed.

As a second aspect of the present disclosure, a display panel is provided, where the display panel includes the above display substrate provided in the present disclosure.

As described above, the display substrate may be used as the color filter substrate, and the display panel further includes an opposite substrate 200 to be aligned and assembled with the color filter substrate. The color filter substrate and opposite substrate 200 may be assembled together by using sealant 100c to form a liquid crystal cell. A part of the black matrix 100b is formed between the sealant 100c and the base substrate 100 of the color filter substrate.

The driving chip 150 is electrically coupled to a printed circuit board 300, and power can be supplied to the driving chip 150 through the printed circuit board.

As a third aspect of the present disclosure, there is provided a mask plate for forming a protection unit in the above display substrate provided by the present disclosure. As shown in FIG. 5, the mask plate includes a light blocking body 230, and the light blocking body 230 is divided into a complete blocking region II and a pattern region I located at a side of the complete blocking region.

A main light transmission portion 210 and a plurality of light transmission units 220 arranged at intervals are formed in the pattern region I, and the main light transmission portion 210 and the plurality of light transmission units 220 penetrate through the light blocking body 230 in a thickness direction of the mask plate. The light transmission units 220 are located at a single side of the main light transmission portion 210, and an area of each of the light transmission units 220 is smaller than that of the main light transmission portion 210. The main light transmission portion 210 is used to form a protection part of the protection unit, and the plurality of light transmission units 220 are used to form a transition part of the protection unit.

When the protection unit is formed of negative photosensitive transparent adhesive, the mask plate provided by the present disclosure can be used for exposing the entire layer of the negative photosensitive transparent adhesive, and the protection unit can be obtained after development. Specifically, forming the protection unit includes the steps of:

coating an entire layer of negative photosensitive transparent adhesive layer on the touch electrode layer;

exposing the photosensitive transparent adhesive layer by using the mask plate shown in FIG. 5; and developing the exposed photosensitive transparent adhesive layer to obtain the protection unit.

A part of the photosensitive transparent adhesive layer corresponding to the complete blocking portion II covers a portion of the touch function part on which no transition part needs to be provided, and the part of the photosensitive transparent adhesive layer corresponding to the complete blocking portion II is not irradiated by light and completely removed during development.

The main light transmission unit is used for exposing the portion of the photosensitive transparent adhesive layer, which is used for forming the protection part, the plurality of light transmission units are respectively used for exposing portions of the photosensitive transparent adhesive layer for forming the plurality of protection blocks, and the plurality of protection blocks can be obtained after development.

The smaller the area of the light transmission unit 220 is, the smaller the amount of light transmission is, and therefore, the smaller the amount of exposure of the photosensitive transparent adhesive layer by the light transmitting unit 220 is, so that the smaller the thickness of the protection block formed from the development is. Therefore, the protection unit having the above-described structure provided by the present disclosure can be easily formed by using the mask plate provided by the present disclosure.

In order to make the thicknesses of the protection blocks for forming the transition part of the protection unit gradually decrease, in an embodiment, for the plurality of light transmission units 220, the areas of the light transmission units 220 decreases progressively in a direction from the pattern region I to the complete blocking region II. That is, among the light transmission units, the farther the light transmission unit away from the main light transmission portion 210, the smaller the area of the light transmitting unit is.

The larger the area of the light transmission unit is, the larger the amount of light transmission is. When two or several consecutive light transmission units are communicated to each other to form a communicated region, the communicated region has a relative large area and the exposure amount thereof is relative large, and thus it is impossible to form ideal "protection blocks of the transition part having thicknesses gradually decreasing in a direction toward the display area". Therefore, when forming the light transmission units, communication between the light transmission units should be avoided.

In order to avoid communication of the light transmission units, in an embodiment, as shown in FIG. 5, the light transmission units 220 are arranged in rows and columns, the light transmission units 220 are all located at a single side of the main light transmitting portion 210 along a longitudinal direction of the main light transmitting portion 210, the row direction of the light transmission units 220 is consistent with the longitudinal direction of the main light transmitting portion 210, and the light transmission units 220 of the odd-numbered columns and the light transmission units 220 of the even-numbered columns are staggered from each other. Such arrangement can ensure that a relative large distance exists between any two adjacent light transmission units in a single row, thereby avoiding the mutual communication between the two adjacent light transmission units.

In an embodiment, the light transmission unit has a shape of semicircular.

As an implementation of the present disclosure, a diameter of the light transmission unit satisfies the following formula:

$$d = l/(2m-1),$$

where l is a width of the main light transmission portion; m is the row number of the row in which the light transmission unit is located, a row of light transmission units closest to the main light transmission portion is a first row of light transmission units, and m is more than or equal to 1;

d is the diameter of the light transmission unit.

The display substrate manufactured by using the mask plate in the present embodiment can effectively prevent moisture and oxygen from eroding the binding part, can avoid air bubbles at a side of the transparent adhesive facing the edge of the display surface of the touch display device after the transparent optical film layer is formed.

Figure 6:
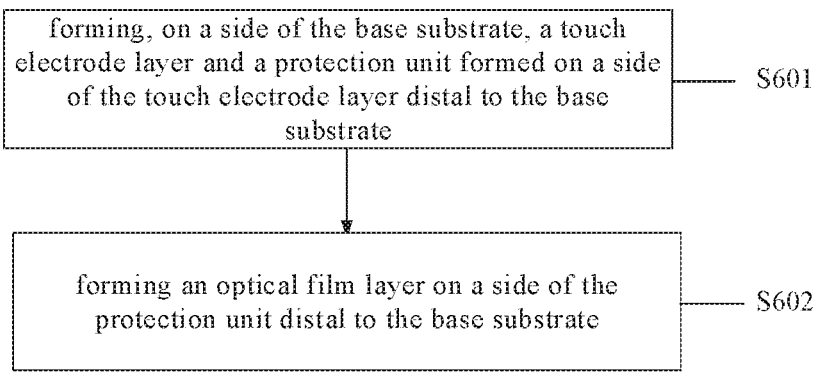
FIG. 6 is a flowchart of a manufacturing method of a display substrate according to an embodiment of the present disclosure.

An embodiment of the present disclosure provides a manufacturing method of a display substrate, as shown in FIG. 6, the manufacturing method includes steps S601 and S602.

In step S601, forming, on a side of the base substrate, a touch electrode layer 100a and a protection unit 140 formed on a side of the touch electrode layer 100a distal to the base substrate 100.

The touch electrode layer 100a includes a touch function part 120 and a binding part 110 located at a side of the touch function part 120, the protection unit 140 includes a protection part 141 and a transition part 142, the protection part 141 is located at a side of the binding part 110 distal to the base substrate 100 and covers the binding part 110, and the transition part 142 is formed at a side of the touch function part 120 distal to the base substrate 100. The transition part 142 includes a plurality of protection blocks 142a, and the protection blocks 142a are arranged at intervals, and a maximum thickness of each of the protection blocks 142a in a normal direction of the base substrate 100 is smaller than a thickness of the protection part 141 in the normal direction of the base substrate 100.

In step S602, forming an optical film layer on a side of the protection unit distal to the base substrate.

In an implementation, the step of forming the protection unit further includes:

coating an entire layer of photosensitive transparent adhesive layer on the side of the touch electrode layer 100a distal to the base substrate;

exposing the photosensitive transparent adhesive layer by using the mask plate in the above embodiment; and developing the exposed photosensitive transparent adhesive layer to obtain the protection unit 140.

In an embodiment, for the protection blocks 142a, the maximum thicknesses of the protection blocks 142a in the normal direction of the base substrate 100 decrease progressively in a direction from the binding part 110 to the touch function part 120, and in a direction from the binding part 110 to the touch function part 120, maximum cross-section areas of the protection block 142a in the direction perpendicular to the normal direction of the substrate decreases progressively.

In an implementation, the protection blocks 142a are arranged in rows and columns, and the protection blocks 142a are located on a single side of the protection part 141 in a longitudinal direction of the protection part 141, the row direction of the protection blocks is identical to the longitudinal direction of the protection part, the column direction of the protection blocks is perpendicular to the longitudinal direction of the protection part, and the protection blocks in odd-numbered columns and the protection blocks in even-numbered columns are staggered from each other in the column direction.

The display substrate manufactured with the manufacturing method can effectively prevent moisture and oxygen from eroding the binding part, can avoid air bubbles at a side of the transparent adhesive facing the edge of the display surface of the touch display device after the transparent optical film layer is formed.

It should be understood that the above embodiments are merely exemplary embodiments employed to illustrate the principles of the present disclosure, and the present disclosure is not limited thereto. It would be apparent to those skilled in the art that various changes and modifications may be made to the above embodiments without departing from the spirit and scope of the present disclosure, and these changes and modifications are to be considered within the scope of the present disclosure.

What is claimed is:

1. A display substrate, comprising a base substrate, a touch electrode layer formed on a light emergent side of the base substrate, and a protection unit formed on a side of the touch electrode layer distal to the base substrate, the touch electrode layer comprises a touch function part and a binding part located at a side of the touch function part, wherein
the protection unit comprises a first part and a second part, the first part is located at a side of the binding part distal to base substrate and covers the binding part, the second part is located at a side of the touch function part distal to the base substrate, and the second part comprises a plurality of protection blocks which are arranged at intervals, a maximum thickness of each of the protection blocks along a normal direction of the base substrate is less than a thickness of the first part along the normal direction of the base substrate.

2. The display substrate according to claim 1, wherein maximum thicknesses of the plurality of protection blocks in the normal direction of the base substrate decrease progressively in a direction from the binding part to the touch function part, and maximum cross-section areas of the plurality of protection blocks in a direction perpendicular to the normal direction of the base substrate decrease progressively in the direction from the binding part to the touch function part.

3. The display substrate according to claim 1, wherein the plurality of protection blocks are arranged in rows and columns, the plurality of protection blocks are located at a single side of the first part in a longitudinal direction of the first part, a row direction of the plurality of protection blocks is identical to the longitudinal direction of the first part, a column direction of the plurality of protection blocks is perpendicular to the longitudinal direction of the first part, and the protection blocks of odd-numbered columns and the protection blocks of even-numbered columns are staggered from each other in the column direction.

4. The display substrate according to claim 3, wherein a cross-section of each of the plurality of protection blocks in a direction perpendicular to the normal direction of the base substrate has a semicircular shape.

5. The display substrate according to claim 4, wherein a diameter of a maximum cross-section of each of the protection blocks in the direction perpendicular to the normal direction of the base substrate satisfies the following formula:

$$D=L/(2n-1),$$

wherein L is a width of the first part;
n is a row number of a row in which the protection block is located, a row of protection blocks closest to the first part is a first row of protection blocks, and n is more than or equal to 1;
D is the diameter of the maximum cross-section of the protection block in the direction perpendicular to the normal direction of the base substrate.

6. The display substrate according to claim 1, further comprising a color filter layer located on a light incident side of the base substrate.

7. The display substrate according to claim 1, further comprising a transparent optical film layer covering the touch electrode layer, wherein the protection unit is located between the transparent optical film layer and the touch electrode layer.

8. The display substrate according to claim 7, wherein the transparent optical film layer comprises a polarizer.

9. A display substrate according to claim 1, wherein the first part has a thickness ranging from 1 μm to 5 μm.

10. A display panel, comprising the display substrate of claim 1.

11. A mask plate for forming the protection unit of the display substrate according to claim 1, and the mask plate comprises a first region and a second region located at a side of the first region, wherein the second region comprises a first light transmission portion and a plurality of second light transmission portions arranged at intervals, the first light transmission portion and the second light transmission portions penetrate through the mask plate in a thickness direction of the mask plate, the plurality of second light transmission portions are located at a single side of the first light transmission portion, an area of each of the second light transmission portions is smaller than an area of the first light transmission portion, the first light transmission portion is configured for forming the first part, and the second light transmission portions are configured for forming the second part.

12. The mask plate according to claim 11, wherein areas of the plurality of second light transmission portions decrease progressively in a direction from the first region to the second region.

13. The mask plate according to claim 11, wherein the plurality of second light transmission portions are arranged in rows and columns, and are located at a single side of the first light transmission portion in a longitudinal direction of the first light transmission portion, a row direction of the plurality of second light transmission portions is identical to the longitudinal direction of the first light transmission portion, a column direction of the plurality of second light transmission portions is perpendicular to the longitudinal direction of the first light transmission portion, and the second light transmission portions of odd-numbered columns and the second light transmission portions of even-numbered columns are staggered from each other in the column direction.

14. The mask plate according to claim 13, wherein the second light transmission portion has a semicircular shape.

15. The mask plate according to claim 14, wherein a diameter of the second light transmission portion satisfies the following formula:

$$d=l/(2m-1),$$

wherein l is a width of the first light transmission portion;
m is a number of a row where the second light transmission portion is located, m is more than or equal to 1, wherein a row of second light transmission portions closest to the first light transmission portion is a first row of second light transmission portions;
d is the diameter of the second light transmission portion.

16. A manufacturing method of a display substrate, the display substrate comprises a base substrate, a touch electrode layer formed on a light emergent side of the base substrate, and a protection unit formed on a side of the touch electrode layer distal to the base substrate, the touch electrode layer comprises a touch function part and a binding part located at a side of the touch function part, the protection unit comprises a first part and a second part, the first part is located at a side of the binding part distal to base substrate and covers the binding part, the second part is located at a side of the touch function part distal to the base substrate, and the second part comprises a plurality of protection blocks which are arranged at intervals, a maximum thickness of each of the protection blocks along a normal direction of the base substrate is less than a thickness of the first part along the normal direction of the base substrate, wherein, the manufacturing method of the display substrate comprises:

forming the touch electrode layer on a side of the base substrate; and forming the protection unit on a side of the touch electrode layer distal to the base substrate.

17. The manufacturing method according to claim 16, the forming the protection unit further comprises:

coating an entire layer of photosensitive transparent adhesive layer on the side of the touch electrode layer distal to the base substrate;

exposing the photosensitive transparent adhesive layer by using a mask plate; and developing the exposed photosensitive transparent adhesive layer to obtain the protection unit.

18. The manufacturing method according to claim 17, further comprising:

forming an optical film layer on a side of the protection unit distal to the base substrate.

19. The manufacturing method according to claim 16, wherein the forming the protection unit further comprises:

forming the plurality of the protection blocks such that maximum thicknesses of the protection blocks decrease progressively in a normal direction of the base substrate, and areas of maximum cross-sections of the protection blocks in a direction perpendicular to the normal direction of the base substrate decrease progressively in a direction from the binding part to the touch function part.

20. The manufacturing method according to claim 19, wherein the forming the protection unit further comprises:

forming the plurality of protection blocks in rows and columns, wherein the protection blocks are located at a single side of the first part in a longitudinal direction of the first part, a row direction of the plurality of protection blocks is identical to the longitudinal direction of the first part, a column direction of the plurality of protection blocks is perpendicular to the longitudinal direction of the first part, and the protection blocks of odd-numbered columns and the protection blocks of even-numbered columns are staggered from each other in the column direction.

21. The manufacturing method according to claim 20, wherein the forming the protection unit further comprises:

forming each of the plurality of protection blocks such that a cross-section of each of the plurality of protection blocks in the direction perpendicular to the normal direction of the base substrate has a semicircular shape.

* * * * *